(12) United States Patent
Matsumoto

(10) Patent No.: US 7,600,173 B2
(45) Date of Patent: Oct. 6, 2009

(54) RETRANSMISSION CONTROL METHOD AND COMMUNICATIONS DEVICE

(75) Inventor: Wataru Matsumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 457 days.

(21) Appl. No.: 10/592,351

(22) PCT Filed: Apr. 28, 2004

(86) PCT No.: PCT/JP2004/006137

§ 371 (c)(1),
(2), (4) Date: Sep. 11, 2006

(87) PCT Pub. No.: WO2005/107081

PCT Pub. Date: Nov. 10, 2005

(65) Prior Publication Data

US 2007/0277082 A1    Nov. 29, 2007

(51) Int. Cl.
*H03M 13/00* (2006.01)
(52) U.S. Cl. .................. 714/755; 714/786; 714/801; 714/748; 714/749; 714/750; 714/781
(58) Field of Classification Search ................ 714/755, 714/786, 790, 762, 788, 748–751, 781, 801
See application file for complete search history.

(56) References Cited

U.S. PATENT DOCUMENTS

2006/0064627 A1* 3/2006 Berens et al. ............... 714/790
2007/0022362 A1* 1/2007 Yue et al. .................... 714/790

FOREIGN PATENT DOCUMENTS

JP    2003-198383 A    7/2003
JP    2004-112800 A    4/2004
WO   WO2004/006444 A1   1/2004

OTHER PUBLICATIONS

Matsumoto et al., "LDPC coded Hybrid Type II ARQ System," Symsposium on Information Theory and Its Applications, pp. 273-276, (2003), XP002990209.
Matsumoto et al., "Irregular Low-Denisty Parity-Check Code Design Based on Euclidean Geometries," IEICE Trans. Fundamentals, vol. E86-A, No. 7, pp. 1820-1834, (2003), XP001174812.
Li et al., "Rate-Compatible Low Density Parity Check Codes for Capacity-Approaching ARQ Schemes in Packet Data Communications," Proceedings of the lasted International Conference Communications, Internet and Information Technology, pp. 201-206, (2002), XP002339009.
Matsumoto et al., "Irregular extended Euclidean geometry low-density parity-check codes," International Symposium on Communication Systems Networks and Digital Signal Processing, pp. 148-151, (2002), XP0022370884.

(Continued)

*Primary Examiner*—Guy J Lamarre
(74) *Attorney, Agent, or Firm*—Birch, Stewart, Kolasch & Birch, LLP

(57) ABSTRACT

A retransmission control method comprising: generating N parity check matrices; generating a generator matrix containing a check symbol generator matrix contained in the first parity check matrix; transmitting the codeword generated by using the generator matrix to another communications device; generating, when the communications device receives a NAK in response to the codeword, a first additional parity by using the second parity check matrix; and retransmitting the first additional parity to the another communications device.

9 Claims, 16 Drawing Sheets

OTHER PUBLICATIONS

Matsumoto et al., "Fundamentals and Applications of Construction Methods of Low-Density Parity-Check Codes," Institute of Electronics, Information and Communication Engineers Society Taikai Koen Ronbunshu, pp. SS17-SS18, (2003), XP002998474.

Matsumoto et al., "Determine irregular low-density parity-check codes design scheme," Proceedings at Kiso Kyokai Society Meeting, vol. A-6-12, p. 126, (2002), XP002903378.

Matsumoto et al., "Irregular Low-Density Parity-Check Code Design based on Integer Lattics," IEEE International Symposium on Information Theory, p. 3, (2003), XP010657031.

Chung et al., "Analysis of Sum-Product Decoding of Low-Density Parity-Check Codes Using a Guassian Approximation," IEEE Transactions on Information Theory, vol. 47, No. 2, pp. 657-670, (2001), XP002969535.

Yazdani et al., IEEE, vol. 8, Issue 3, Mar. 2004, apges 159-161.

Jing Xu, Master's Thesis, Chalmers University of Technology School of Electrical and Computer Engineering.

Sesia, Stefania et al., The Throughput of an LDPC-Based Incremental-Redundancy Scheme over Block-Fading Channels, Information Theory Workshop, 2002, Proceedings of the 2002 IEEE, IEEE, Banglore, India, Oct. 20-25, 2002, pp. 15-18.

\* cited by examiner

FIG.9

| rate | rate=0.6 |
|---|---|
| DEGREE i | COLUMN DEGREE RATE $\lambda_i(R(3))$ |
| 1 | |
| 2 | 0.01 |
| 3 | 0.970022733 |
| 4 | 0.019977267 |
| DEGREE i | ROW DEGREE RATE $\rho_i(R(3))$ |
| 2 | |
| 7 | 1/2 |
| 8 | 1/2 |
| AVERAGE OF ρ | 7.5 |

FIG.10

| | $H_{R(3)=0.6}$ | |
|---|---|---|
| DEGREE i | COLUMN DEGREE RATE $\lambda_i(R(3))$ | NUMBER OF COLUMNS $n_v(x,R(3))(m'=1000)$ |
| 1 | | |
| 2 | 0.0372 | 279 |
| 3 | 0.9372 | 4686 |
| 4 | 0.0256 | 96 |
| DEGREE i | ROW DEGREE RATE $\rho_i(R(3))$ | NUMBER OF ROWS $n_c(x,R(3))(m'=1000)$ |
| 2 | | |
| 3 | | |
| 7 | 1/2 | 1000 |
| 8 | 1/2 | 1000 |
| ROW DEGREE AVERAGE | 7.5 | |

FIG.12

| Degree i | H_{R(3)}=0.6 Column degree rate $\lambda_i(R(3))$ | H_{R(3)}=0.6 Number of columns $n_v(x,R(3))$ (m=1000) | H_{R(2)}=0.5 Column degree rate $\lambda_i(R(2))$ | H_{R(2)}=0.5 Number of columns $n_v(x,R(2))$ (m=1000) | $A_{R(2)}=0.5$ Number of columns |
|---|---|---|---|---|---|
| 1 | | | | | |
| 2 | 0.0372 | 279 | 0.0361 | 325 | 69 columns identical to $\lambda_4(R(3))$: 23  /  columns identical to 0: 46 |
| 3 | 0.9372 | 4686 | 0.94 | 5640 | 954 columns identical to 0: 954 |
| 4 | 0.0256 | 96 | | 73 | |
| 5 | | | | | |
| 6 | | | 0.0162 | | |
| 7 | | | 0.0077 | 23 | |

| Degree i | Row degree rate $\rho_i(R(3))$ | Number of rows $n_c(x,R(3))$ (m=1000) | Row degree rate $\rho_i(R(2))$ | Number of rows $n_c(x,R(2))$ (m=1000) |
|---|---|---|---|---|
| 2 | | | 1/3 | 1000 |
| 3 | | | 1/3 | 1000 |
| 7 | 1/2 | 1000 | 1/3 | 1000 |
| 8 | 1/2 | 1000 | | |
| Row degree average | 7.5 | | 6 | |

RETRANSMISSION CONTROL METHOD AND COMMUNICATIONS DEVICE

TECHNICAL FIELD

The present invention relates to a retransmission control method for a system using low-density parity-check (LDPC) codes as error correcting codes, and a communications device forming the system, and more specifically, a retransmission control method and a communications device when the LDPC codes are applied to Type-II Hybrid Automatic Repeat reQuest (HARQ).

BACKGROUND ART

Hereinafter, a conventional retransmission control method is explained. For example, for error control, Forward Error Correction code (FEC) and Automatic Repeat reQuest (ARQ) are available, and in packet transmission, error free transmission must be guaranteed, so that error control by ARQ is essential. Particularly, in a system that improves the throughput by selecting an optimum modulation method and coding method according to the propagation path status (adapted modulation and demodulation/error correction), packet errors are inevitable, so that an HARQ method with an FEC function is necessary.

As the HARQ method, Type-I HARQ in which a retransmitting packet is identical to an original packet, and Type-II HARQ in which a retransmitting packet is different from an original packet, are available.

Herein, an example of the Type-II HARQ is explained. In Type-II HARQ, data bits are transmitted at the time of initial transmission and parity bits for error correction are transmitted at the time of retransmission in principle, and as an example, a system using turbo codes to which the Type-II HARQ is applied is explained herein (refer to Non-patent Document 1). For example, in a system using turbo codes, a communications device on a transmitting side encodes a data signal sequence at a code rate R, and then thins-out redundant bits (parity bits) after being encoded based on a predetermined method of elimination, and then transmits these. Then, at the time of retransmission, a packet composed of only an additional parity different from the initially transmitted packet is transmitted. On the other hand, in a communications device on a receiving side, the initially transmitted receiving packet stored in a receiving buffer and a retransmitting packet are synthetically encoded, and decoding is carried out at a smaller code rate according to the number of times of retransmission.

In the Type-II HARQ, this series of processes is repeated until no error is detected, whereby error-free transmission is realized, and furthermore, by improvement in coding gain, the receiving performance is improved.

Non-patent document 1
J. Xu, "Turbo Coded Hybrid Type II ARQ System" Master's thesis, Chalmers University of Technology, School of Electrical and Computer Engineering, 2002.

However, in the retransmission control method using turbo codes in the document, the larger the number of bits to be deleted, the longer the distance from the Shannon limit, resulting in deterioration in performance. In addition, in the retransmission control method using turbo codes, even when an additional parity is transmitted at the time of retransmission, it is unknown whether the selected parity is optimum, so that there is a possibility that the original performance of turbo codes cannot be obtained.

The invention was made in view of the circumstances, and an object thereof is to provide a retransmission control method and a communications device which can always obtain the original performance of error correcting codes.

DISCLOSURE OF INVENTION

A retransmission control method according to the present invention is a retransmission control method for a transmitting side communications device which employs low-density parity check codes as error correcting codes, transmits a codeword that has been encoded at a predetermined code rate at the time of initial transmission, and transmits an additional parity at the time of retransmission. The retransmission control method includes: a check matrix generating step of generating a parity check matrix for initial transmission, optimized at a specific code rate, and parity check matrices for retransmissions (the number of retransmission times is arbitrary), optimized in a phased manner while lowering the code rate; an initial transmission irreducible standard format generator matrix generating step of converting the parity check matrix of the initial transmission into an irreducible standard format check matrix (composed of a check symbol generator matrix and a unit matrix); an initial transmission irreducible standard format generator matrix generating step of generating an initial transmission irreducible standard format generator matrix containing the check symbol generator matrix; a codeword generating and transmitting step of generating and transmitting a codeword by using the irreducible standard format generator matrix and data (m) with a fixed length of the initial transmission; and a retransmission controlling step of generating and transmitting an additional parity based on a parity check matrix (corresponding to one of the parity check matrices of the retransmissions) corresponding to a code rate one level lower than a current code rate, generated at the check matrix generating step when NAK is received from a receiving side communications device. When NAK is received thereafter, the retransmission controlling step is repeatedly carried out while lowering the code rate one level by step.

In the retransmission control method according to the present invention, as error correcting codes when the Type-II HARQ is employed, for example, LDPC codes with excellent characteristics very close to the Shannon limit are applied, and for retransmission, a generator matrix for retransmission is generated from a parity check matrix corresponding to a code rate lower than the code rate of the initial transmission or the previous retransmission, and based on the generation results, only the additional parity is transmitted.

BRIEF DESCRIPTION OF DRAWINGS

FIG. 9 is a diagram of degree distributions after optimized calculation; FIG. 10 is a diagram of degree distributions after adjustment; FIG. 12 is a diagram of degree distributions obtained as a result of optimized calculation.

BEST MODE(S) FOR CARRYING OUT THE INVENTION

The invention is explained in greater detail with reference to the accompanying drawings.

Figure 1:
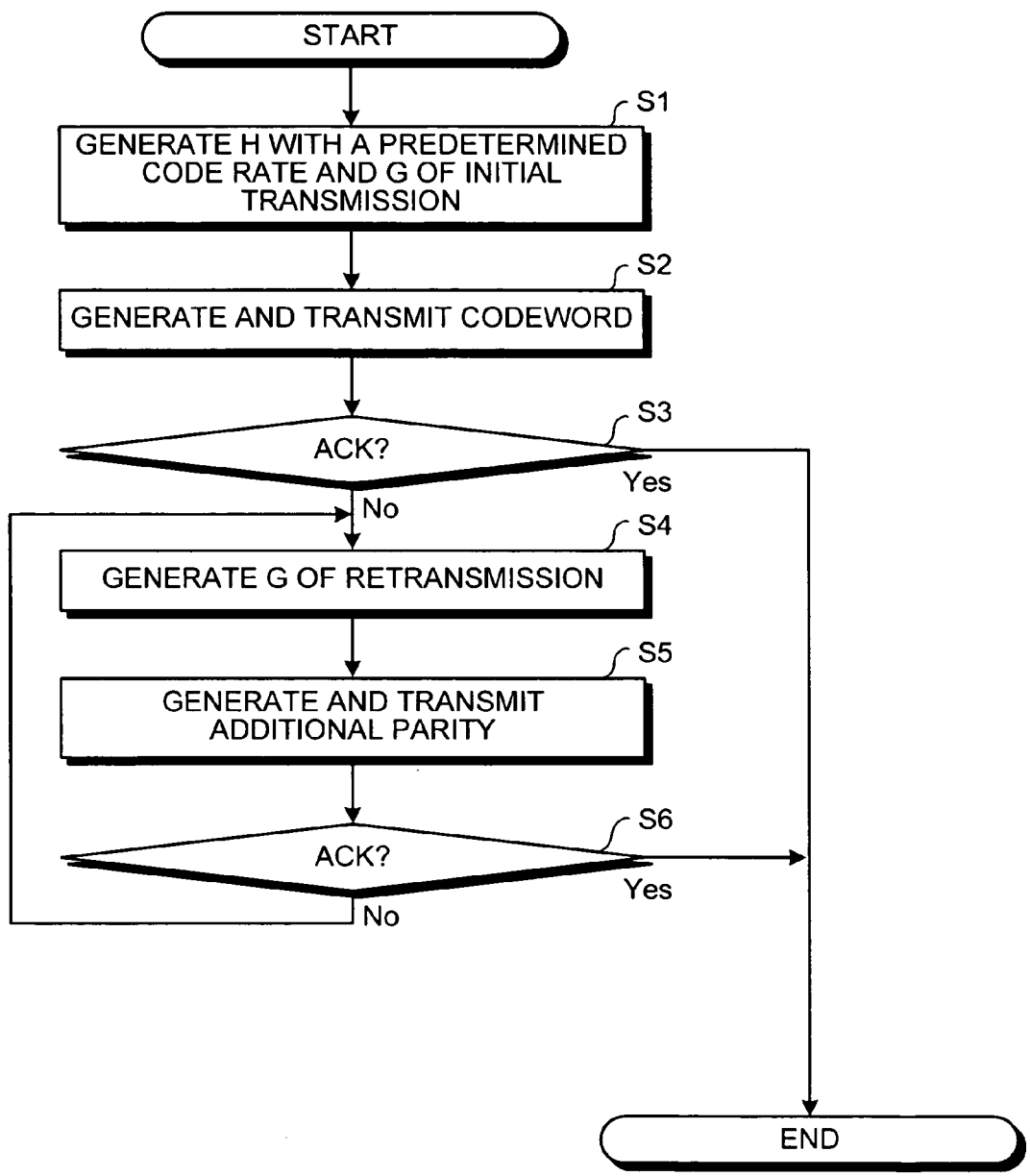
FIG. 1 is a flowchart of a retransmission control method (processing of a communications device on a transmitting side) according to the invention.
Figure 2:
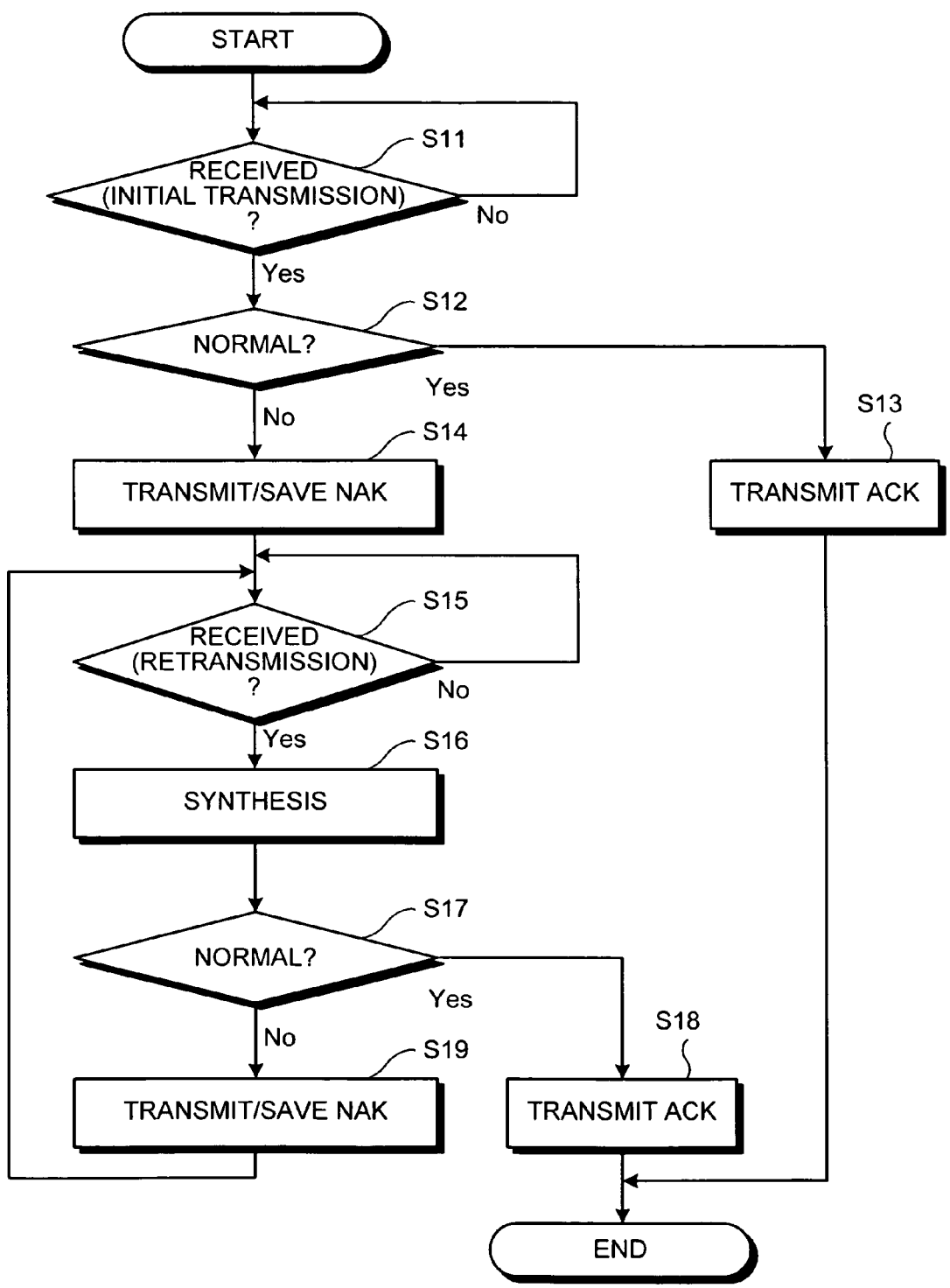
FIG. 2 is a flowchart of a retransmission control method (processing of a communications device on a receiving side) according to the invention.

FIG. 1 and FIG. 2 are flowcharts of a retransmission control method relating to the invention, and in detail, FIG. 1 depicts processing of a communications device on a transmitting side, and FIG. 2 depicts processing of a communications device on a receiving side. Herein, a retransmission control method to which, as error correcting codes when the Type-II HARQ is used, for example, LDPC codes having excellent properties very close to the Shannon limit are applied, is explained.

A parity check matrix $H_{R(L)}$ for LDPC codes in this embodiment may be generated within the communications device according to set parameters, or may be generated in another control device (calculator, etc.) outside the communications device. When the parity check matrix $H_{R(L)}$ is generated outside the communications device, the generated parity check matrix $H_{R(L)}$ is stored in the communications device. Subsequent embodiments are when the parity check matrix $H_{R(L)}$ is generated within the communications device. Herein, R(L) expresses a code rate, and L=1, 2, 3 . . . , max(0<R(1)<R(2)< . . . <R(max-1)<R(max)=1). R(max) means non-coding.

Herein, before explaining the retransmission control method of this embodiment, first, positioning of an encoder and a decoder that can realize the retransmission control method of this embodiment is explained.

Figure 3:
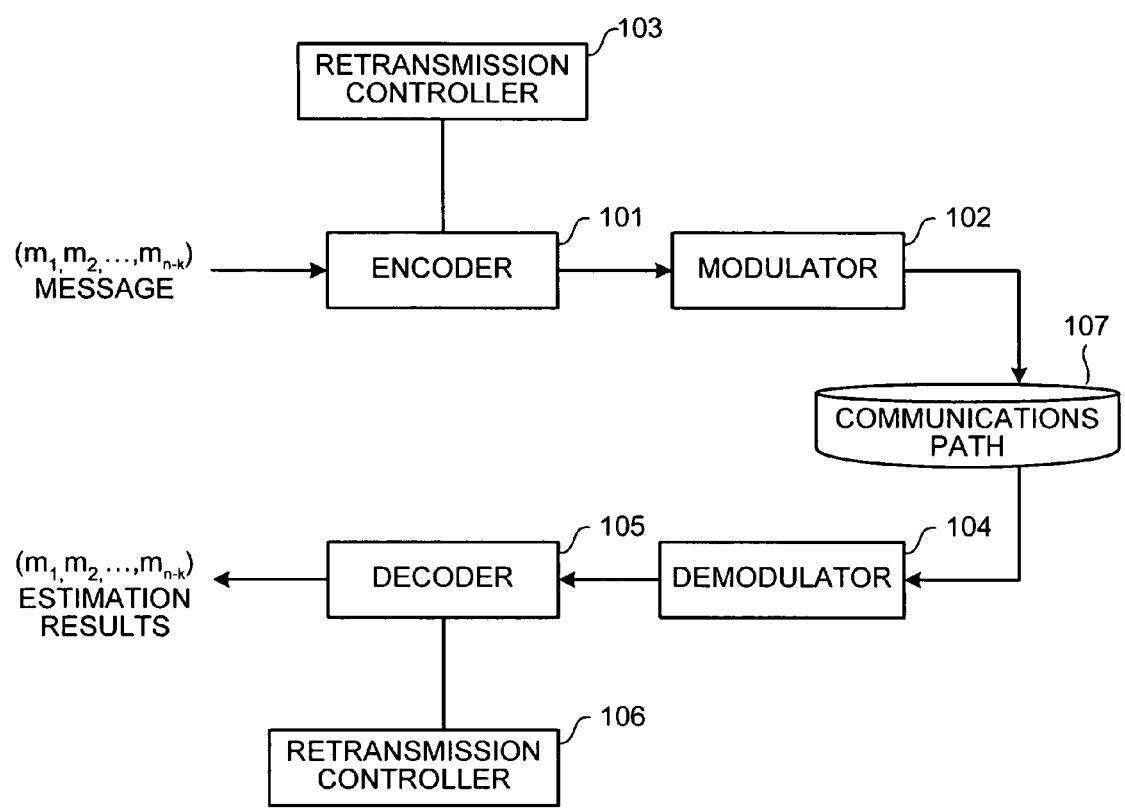
FIG. 3 is a diagram of an LDPC encoding/decoding system.

FIG. 3 is a diagram of an LDPC encoding/decoding system. In FIG. 3, the communications device on the transmitting side includes an encoder 101, a modulator 102, and a retransmission controller 103, and the communications device on the receiving side includes a demodulator 104, a decoder 105, and a retransmission controller 106. Herein, for convenience, the construction necessary for the transmitting side (construction of the transmitter) and the construction necessary for the receiving side (construction of the receiver) are separated, however, without limitation to this, it is also possible that they both have the constructions as a communications device that can realize bidirectional communications.

In the encoder 101 on the transmitting side, for example, by a parity check matrix construction method of this embodiment to be explained later, parity check matrices of $H_{R(max-1)}$ through $H_{R(1)}$ for LDPC codes according to a desired code rate are generated. For example, at the time of initial transmission (code rate: R(L)), a generator matrix $G_{R(L)}$ is calculated based on the following conditions. $G_{R(L)}$: (n-k)×n matrix (n-k: data length, n: code length) $H_{R(L)} \times G_{R(L)} = 0$ Thereafter, the encoder 101 receives messages with a data length of n-k ($m_1, m_2 \ldots m_{n-k}$) and generates a codeword $C_{R(L)}$ with a code length by using the generator matrix $G_{R(L)}$. $C_{R(L)} = (m_1, m_2 \ldots m_{n-k}) \times G_{R(L)} = (c_1, c_2 \ldots c_n)$ (herein, $H_{R(L)} (c_1, c_2 \ldots c_n)^T = 0$)

Then, the modulator 102 applies digital modulation of Bi-Phase Shift Keying (BPSK), Quadrature Phase Shift Keying (QPSK), multilevel Quadrature Amplitude Modulation (QAM), etc., to the generated codeword $C_{R(L)}$, and transmits it.

On the other hand, on the receiving side, the demodulator 104 applies digital demodulation of BPSK, QPSK, or multilevel QAM, etc., to the modulated signal received through the communications path 107, and furthermore, the decoder 105 repeatedly decodes the results of demodulation subjected to LDPC encoding by using a "sum-product algorithm," and outputs the estimation results (corresponding to the original $m_1, m_2 \ldots m_{n-k}$).

Figure 4:
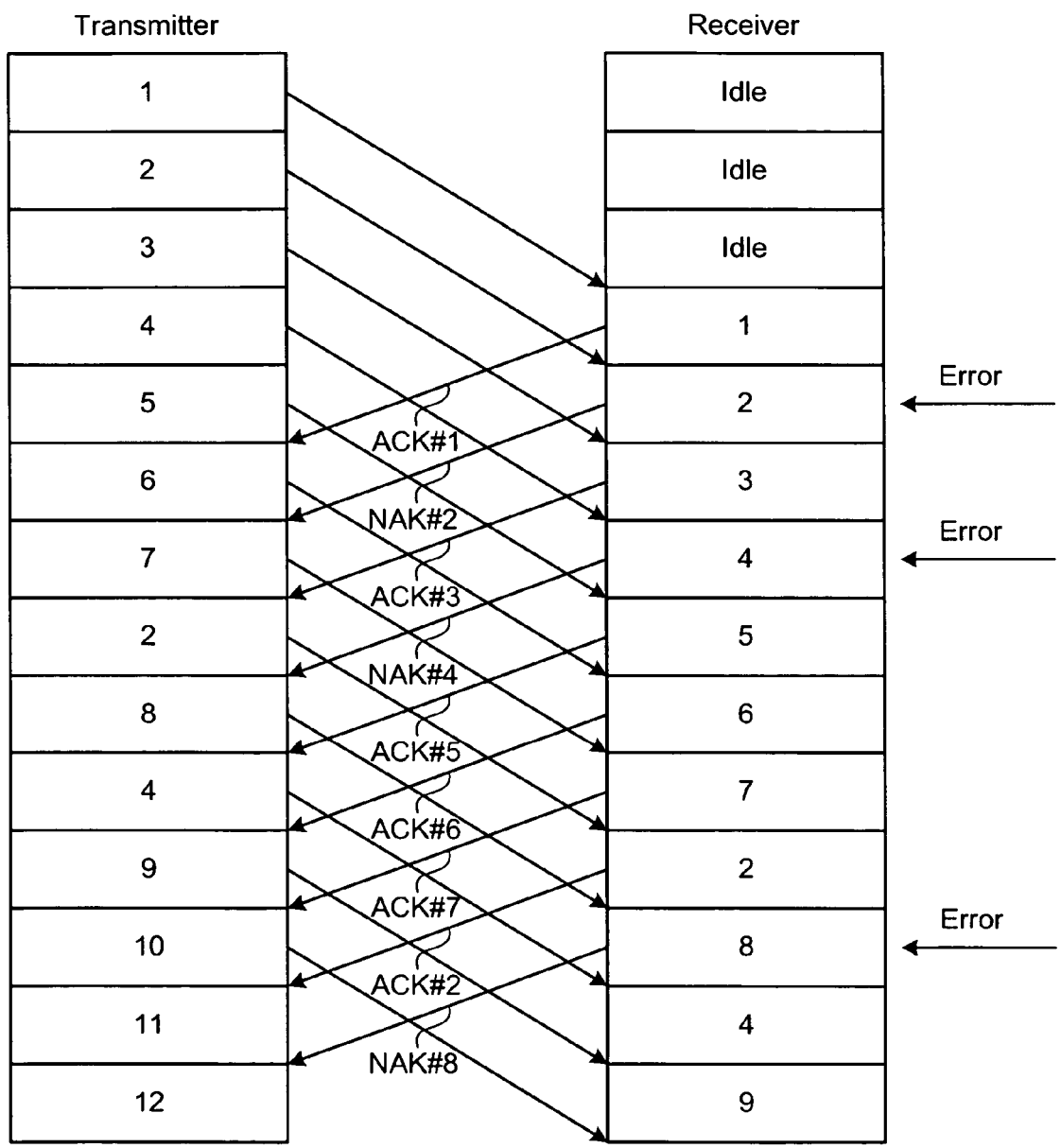
FIG. 4 is a diagram of processing of Type-II HARQ.

Then, operations of each communications device in the LDPC encoding/decoding system, that is, the retransmission control device in this embodiment is explained in detail with reference to FIG. 1 and FIG. 2. In this embodiment, for convenience, retransmission control focusing on one data sequence is explained, however, in the Type-II HARQ, normally, as shown in FIG. 4, a plurality of data sequences are serially transmitted, and retransmission control is carried out when Negative AcKnowledgement (NAK (NAK#2, NAK#4, and NAK#8)) is replied.

First, in the communications device on the transmitting side, the encoder 101 calculates a parity check matrix $H_{R(L)}$ (matrix of n×k) for LDPC codes of initial transmission based on a predetermined code rate R(L), and further calculates parity check matrices of $H_{R(L-1)}, H_{R(L-2)} \ldots$ for LDPC codes of retransmission, re-retransmission and so on while lowering the code rate (data length is fixed) (Step S1 of FIG. 1). Then, a generator matrix $G_{R(L)}$ ((n-k)×n) is calculated satisfying "$H_{R(L)} \times G_{R(L)} = 0$" is calculated from the initial transmission parity check matrix $H_{R(L)}$ (Step S1).

Herein, the method of composing a parity check matrix for LDPC codes in the encoder 101 is described in detail. In this embodiment, as an example, a parity check matrix composing method (details of Step S1 of FIG. 1) for irregular-LDP codes based on the Euclidean geometry is described.

Figure 5:
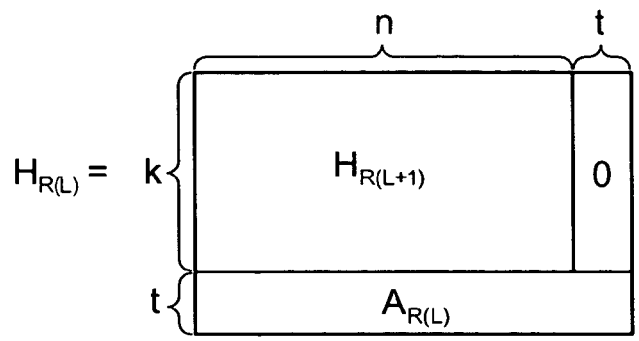
FIG. 5 is a diagram of a construction of a parity check matrix $H_{R(L)}$.

The parity check matrix $H_{R(L)}$ can be defined, when being expressed by a general formula, as the following formula (1) by using a parity check matrix $H_{R(L+1)}$ with a one higher code rate and an additional parity check matrix $A_{R(L)}$. FIG. 5 is a diagram showing the outline of the formula (1).

$$H_{R(L)} = \left[ \frac{H_{R(L+1)} | 0}{A_{R(L)}} \right] \quad (1)$$

$$R(L) = (n-m)/(n+t)$$

Herein, the parity check matrix $H_{R(L)}$ and the parity check matrix $H_{R(L+1)}$ are full rank (linearly independent).

In this embodiment, the degree distributions of the parity check matrix $H_{R(L)}$ (L=1, 2 . . . max) are optimized by Gaussian approximation. Namely, degree distributions of the parity check matrix $H_{R(L)}$, which minimize the following formula (2), are calculated.

$$\sum_{L=1}^{max} GAP_{R(L)} \quad (2)$$

Herein, $GAP_{R(L)}$ expresses the difference between SNR of an iterative threshold of the parity check matrix $H_{R(L)}$ estimated by Gaussian approximation and the Shannon limit in units of dB.

To calculate degree distributions of the parity check matrix $H_{R(L)}$ which minimize the following formula (2), for example, the following formula (3) is calculated, that is, calculation for searching for $\lambda(x, R(L))$ and $\rho(x, R(L))$ up to a gauss noise $\sigma_n(R(L))$ is carried out. Constraints when the following formula (3) is calculated are shown by the following formula (4), formula (5), formula (6), and formula (7).

$$\sum_{L=1}^{max} \sigma_n(R(L)) \quad (3)$$

$$\frac{\int_0^1 \rho(x, R(L))}{\int_0^1 \lambda(x, R(L))} = 1 - R(L)$$

$\lambda(x,R(L))=\lambda_1(R(L))+\lambda_2(R(L))x^1+\ldots+\lambda_{dv(max,R(L))}(R(L))x^{dv(max,R(L))-1}$ $\rho(x,R(L))=\rho_1(R(L))+\rho_2(R(L))x^1+\ldots+\rho_{dc(max,R(L))}(R(L))x^{dc(max,R(L))-1}$ (4)

$\lambda(x,R(L))=1$ $\rho(x,R(L))=1$ (5)

$$r > \sum_{i=2}^{dv(max,R(L))} \lambda_i(R(L)) \quad (6)$$

$$\phi\left(s + (i-1)\sum_{j=2}^{dc(max,R(L))} \rho_j(R(L))\phi^{-1}(1-(1-r)^{j-1})\right)$$

$\forall r \in (0, \phi(s))$ $0 \le \lambda_i(R(L)) \le 1, \lambda_i(R(L)) \in R$ $0 \le \rho_i(R(L)) \le 1, \rho_i(R(L)) \in R$ $$\phi(x) = \begin{cases} 1 - \frac{1}{\sqrt{4\pi x}} \int_R \tanh\frac{u}{2} \cdot e^{-\frac{(u-x)^2}{4x}} du, & \text{if } x > 0 \\ 1, & \text{if } x \le 0 \end{cases}$$

$$\lambda_x(R(L-1)) \le \frac{\left(\sum_{i=2}^{x} n_v(i, R(L)) \times i\right) - \left(\sum_{j=2}^{x-1} n_v(j, R(L-1)) \times j\right) + X \times t}{\text{total number of "1" in } H_{R(L-1)}} \quad (7)$$

Herein, $\lambda_i(R(L))$ expresses a ratio of the i-th-degree column of the parity check matrix $H_{R(L)}$, and $\rho_i(R(L))$ expresses a ratio of the i-th-degree row of the parity check matrix $H_{R(L)}$. dv(max, R(L)) expresses the maximum degree of the columns of the parity check matrix $H_{R(L)}$, and dc(max, R(L)) expresses the maximum degree of the rows of the parity check matrix $H_{R(L)}$. $\lambda(x, R(L))$ expresses a formation function of degree distributions of the columns of the parity check matrix $H_{R(L)}$, and $\rho(x, R(L))$ expresses a formation function of degree distributions of the rows of the parity check matrix $H_{R(L)}$. $n_v(i, R(L))$ expresses the number of i-th-degree columns of the parity check matrix $H_{R(L)}$, and $n_c(i, R(L))$ expresses the number of i-th-degree rows of the parity check matrix $H_{R(L)}$.

Figure 6:
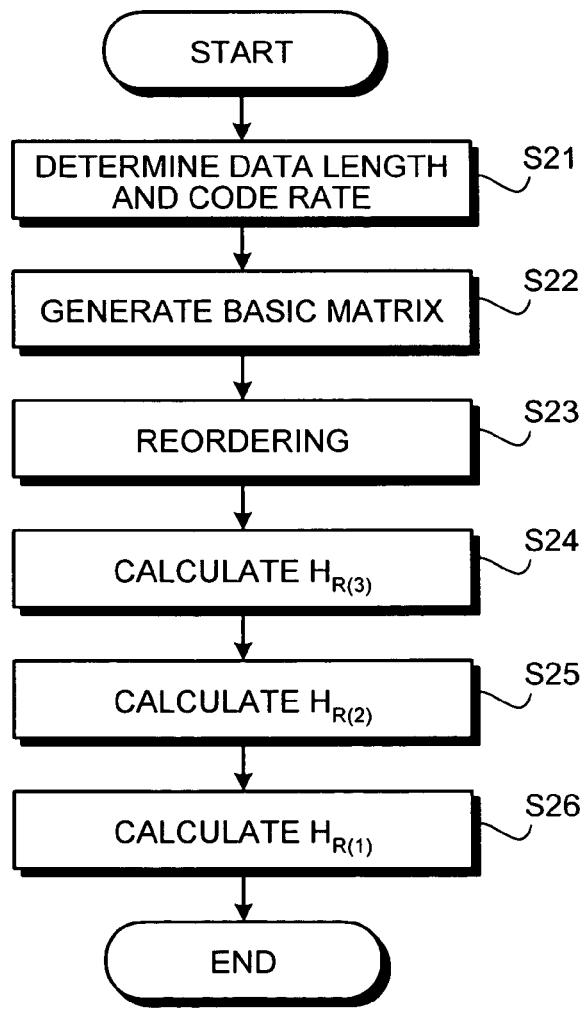
FIG. 6 is a flowchart of an "Irregular-LDPC codes" composition method based on Euclidean geometry codes.

Hereinafter, as an example of processing to calculate the parity check matrix $H_{R(L)}$ at Step S1, processing to calculate the parity check matrix $H_{R(3)}$, the parity check matrix $H_{R(2)}$, and the parity check matrix $H_{R(1)}$ is explained in detail. FIG. 6 is a flowchart of an "irregular-LDPC codes" composition method based on Euclidean geometry codes.

First, the encoder 101 determines the data length and code rate (Step S21 of FIG. 6). Herein, for example, the data length is set to n−k=3000, and the code rate is set to R(3)=0.6, R(2)=0.5, and R(1)=0.375. In this case, the code length (data length/code rate) at the time of initial transmission is n=5000, and the code length at the time of retransmission is n+t1=6000 (t1=1000), and the code length at the time of re-retransmission is n+t1+t2=8000 (t2=2000).

Next, the encoder 101 selects the Euclidean geometry codes EG $(2, 2^5)$ and generates basic matrices A (s=5, R(3)), A (s=5, R(2)), and A (s=5, R(1)) as bases of the parity check matrix for the "irregular-LDP codes" (Step S22). For example, when s=5, the weight distribution to the first row (column index of "1") of the Euclidean geometry codes EG $(2, 2^5)$ is as follows.

{1 32 114 136 149 223 260 382 402 438 467 507 574 579 588 622 634 637 638 676 717 728 790 851 861 879 947 954 971 977 979 998}

In encoding/decoding using the LDPC codes, generally, the less the "cycle 4" and "cycle 6" are on the bipartite graph, the more excellent performance obtained. Therefore, in this embodiment, "1" is thinned out properly from the weight distributions of the Euclidean geometry codes EG $(2, 2^5)$ so as to prevent few cycles such as "cycle 4" and "cycle 6." The weight distributions after thinning out are, for example, as follows.

{1 32 114 136 149 223 260 402 438 467 507 574 588 634 638 717 728 790 861 947 971 979}

Then, based on the weight distributions after thinning out, the weight distributions of the first rows of the respective basic matrices are determined (assigning the positions of "1," individually), and the weight distributions are cyclically shifted, whereby basic matrices A(s=5, R(3)), A (s=5, R(2)), and A (s=5, R(1)) of 1023 rows×1023 columns are generated. In this embodiment, the weight distributions of the first rows of the respective basic matrices are determined, for example, as follows.

A(s=5, R(3))={1 32 114 149 260 402 467 507 574 634 717 728 790 861 979}

A (s=5, R(2))={223 438 947}

A (s=5, R(1))={136 588 638 971}

Thereby, the maximum degree of the columns of the parity check matrix $H_{R(3)}$ becomes dv(max, R(3))=15, the maximum degree of the columns of the parity check matrix $H_{R(2)}$ becomes dv(max, R(2))=3, and the maximum degree of the columns of the parity check matrix $H_{R(1)}$ becomes dv(max, R(1))=4. In addition, the maximum degree of the rows of the parity check matrix $H_{R(3)}$ becomes dc(max, R(3))=15, the maximum degree of the rows of the parity check matrix $H_{R(2)}$ becomes dc(max, R(2))=3, and the maximum degree of the rows of the parity check matrix $H_{R(1)}$ becomes dc(max, R(1))=4.

Next, the encoder 101 reorders the basic matrices according to the following procedures so that the positions of "1" in the columns reach as high as possible (Step S23). The reordering procedures are generally expressed by the following formula (8).

$$h_k(X) \in GF(2)[X] / X^{(2^{2s}-1)} \quad (8)$$

$$k = \{1, 2, \ldots, 2^2 \cdot (2^{2s} - 1)\}$$

$$\begin{bmatrix} h_{i+0}(X) \\ h_{i+1}(X) \\ h_{i+2}(X) \\ \vdots \\ \vdots \end{bmatrix} = \begin{bmatrix} X^{-(w1-1)} \\ X^{-(w2-1)} \\ X^{-(w3-1)} \\ \vdots \\ \vdots \end{bmatrix} \cdot [(X^{(w1-1)} + X^{(w2-1)} + \cdots) \cdot X^{(i-1)}]$$

Herein, i=1 to $2^{2S}-1$. The polynomial $(X^{(w1-1)} + X^{(w2-1)} + \ldots)$ of the formula (8) expresses the first row of each basic matrix. For example, when the positions of weights in the basic matrix are at $\{1\ 7\ 9\ \ldots\ 40\}$, $1 + X^{(7-1)} + X^{(9-1)} + \ldots X^{(40-1)}$.

Then, in the formula (8), when $h_i(X) = h_j(X)$ is present in the case of i=1 to $2^{2s}-1$ and j=1 to i−1, $h_i(X)$ is deleted. By this reordering, the columns with heavier weights can remain as many as possible during row deletion (shortening) described later, and weight variations in the columns can be reduced to as few as possible.

Figure 7:
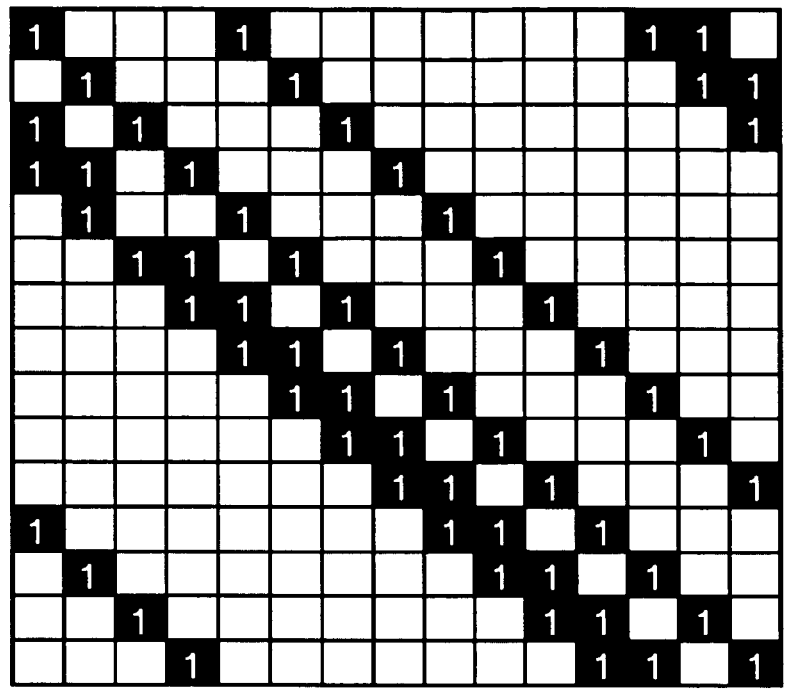
FIG. 7 is a diagram of a matrix of a Euclidean geometry code $(2, 2^2)$.
Figure 8:
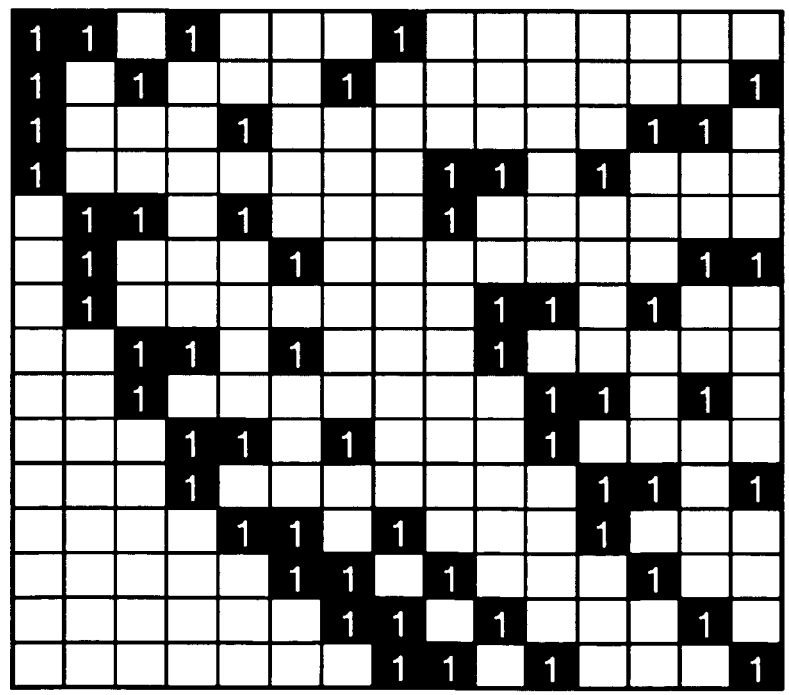
FIG. 8 is a diagram of a matrix after reordering.

As a detailed example, when Euclidean geometry codes EG $(2, 2^2)$ are set as a basic matrix and the reordering is carried out, the matrix shown in FIG. 7 is reordered into the matrix shown in FIG. 8. FIG. 7 is a diagram of the matrix of the Euclidean geometry codes EG $(2, 2^2)$ (the blank represents zero), and FIG. 8 is a diagram of the matrix after being reordered.

Next, the encoder 101 executes, by using the data length n−k=3000 (code length n=5000), the code rate R(3)=0.6, and the reordered basic matrix A(s=5, R(3)), processing (optimized calculation) to calculate a parity check matrix $H_{R(3)}$ of n×k (5000 columns×2000 rows) (Step S24).

Herein, first, generator functions λ(x, R(3)) and ρ(x, R(3)) up to the Gaussian noise σn(R(3)) are searched for. In this case, the formulas (4), (5), and (6) are constraints. FIG. 9 is a diagram of degree distributions after the optimized calculation.

Next, the encoder 101 calculates a shortened matrix based on the basic matrix A (s=5, R(3)), the average of ρ and the code rate R(3) shown in FIG. 9. First, the number of row divisions $Z_{R(3)}$ is calculated by using the average of ρ.

$$\text{Number of row divisions } Z_{R(3)} = \text{Number of elements of } A \quad (9)$$
$$= (s = 5, R(3))/\text{average of } \rho$$
$$= 15/7.5$$
$$= 2$$

Then, the number of rows of the shortened matrix is calculated by using the number of row divisions.

$$\begin{aligned}\text{Number } m' \text{ of rows} \\ \text{of the shortened matrix}\end{aligned} = \text{code length} \times (1 - R(3)) / \quad (10)$$

the number of row divisions $$5000 \times (1 - 0.6)/2 = 1000$$

Namely, herein, 23 rows are deleted from the lowest rank of the basic matrix A(s=5, R(3)) with 1023 rows to generate a shortened matrix A'(s=5, R(3)).

Next, in the encoder 101, while the degree rates ρi(R(3)) and the degrees i of the rows are fixed, the number of columns $n_v(i, R(3))$ with the degree i=2, 3, and 4 of the parity check matrix $H_{R(3)}$ and the number of rows $n_c(i, R(3))$ with the degree i=7 and 8 of the parity check matrix $H_{R(3)}$, which can be composed by using the shortened matrix A'(s=5, R(3)) are calculated. Herein, the degree rates λi(R(3)) of the columns are adjusted so that the columns of the matrix after being divided are 5000 columns. FIG. 10 is a diagram of degree distributions after adjustment.

Figure 11:
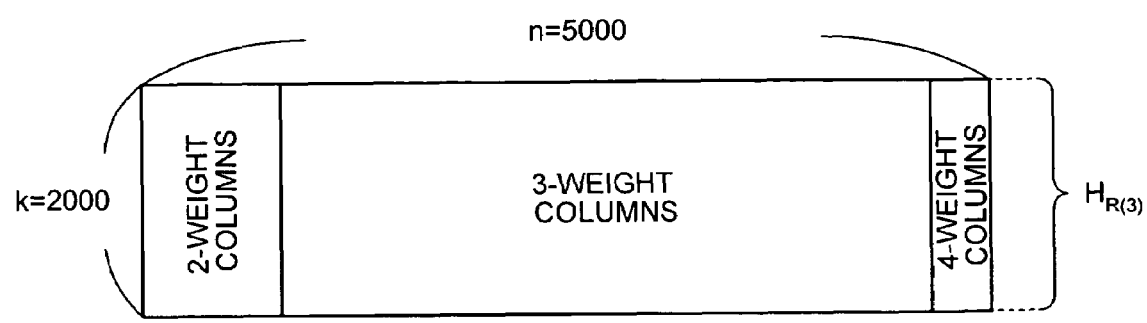
FIG. 11 is a diagram of a parity check matrix $H_{R(3)}$.

Thereafter, the encoder 101 divides, based on the degree distributions shown in FIG. 10, the rows and columns of the shortened matrix A'(s=5, R(3)) and defines the results as a parity check matrix with 5000 columns×2000 rows. Furthermore, the columns of the parity check matrix $H_{R(3)}$ after dividing are reordered so that the weights of the columns are in ascending order, and the reordered matrix is defined as a parity check matrix $H_{R(3)}$ (n×k matrix). FIG. 11 depicts the parity check matrix $H_{R(3)}$. Herein, the rows with a weight of "7" are 1000 rows, the rows with a weight of "8" are 1000 rows, the columns with a weight of "2" are 279 columns, the columns with a weight of "3" are 4686 columns, and the columns with a weight of "4" are 96 columns.

The division processing for the shortened matrix in this embodiment (also including the division processing described later) is not regularly executed, but is carried out by extracting "1" from the rows and columns at random (random dividing). For this extraction, any method can be used as long as the randomicity is maintained.

Next, the encoder 101 executes, by using the determined data length n−k=3000 (code length n+t1=6000), the code rate R(2)=0.5, the reordered basic matrix A(s=5, R(2)), and the parity check matrix $H_{R(3)}$, processing (optimized calculation) to calculate the parity check matrix $H_{R(2)}$ and an additional matrix $A_{R(2)}$ shown by the following formula (11) (Step S25). Herein, only the processing different from the processing of calculation of the parity check matrix $H_{R(3)}$ is explained.

$$H_{R(2)} = \begin{bmatrix} H_{R(3)} | 0 \\ A_{R(2)} \end{bmatrix} \quad (11)$$

First, the encoder 101 searches for generator functions λ(x, R(2)) and ρ(x, R(2)) up to the Gaussian noise $\sigma_n(R(2))$. In this optimized calculation, the formula (7) is a constraint in addition to the formulas (4), (5), and (6).

Therefore, for example, constraints for the second degree, the third degree, and the fourth degree of the parity check matrix $H_{R(2)}$ are the formulas (12), (13), and (14), respectively.

$$\lambda_2(R(L-1)) \leq \frac{n_v(2, R9L)) \times 2 + t \times 2}{1000 \times 15 + 1000 \times 3} \quad (12)$$
$$= \frac{279 \times + 1000 \times 2}{18000}$$
$$= 0.1421$$

-continued $$\lambda_3(R(L-1)) \leq \frac{n_v(3, R(L)) \times 3 + n_v(2, R(L)) \times 2 -}{1000 \times 15 + 1000 \times 3} \quad (13)$$

$$= \frac{4686 \times 3 + 279 \times 2 - n_v(2, R(L-1)) \times 2 + 3000}{18000}$$

$$0.9787 - \lambda_2(R(L-1))$$

$$\lambda_4(R(L-1)) \leq (n_v(4, R(L)) \times 4 + n_v(3, R(L)) \times 3 + n_v \quad (14)$$
$$(2, R(L)) \times 2 - (n_v(3, R(L-1)) \times 3 + n_v$$
$$(2, R(L-1)) \times 2) + t \times 4)/(1000 \times 15 +$$
$$1000 \times 3)$$
$$\frac{96 \times 4 + 4686 \times 3 + 279 \times 2 - (n_v(3, R(L-1)) \times}{18000}$$
$$\frac{3 + n_v(2, R(L-1)) \times 2) + 1000 \times 4}{18000}$$
$$1.0552 - \lambda_3(R(L-1))()$$

Furthermore, the maximum degree of the parity check matrix $H_{R(2)}$ satisfying the following formula (15) is also a constraint.

$$\begin{aligned}\text{maximum degree of the} \\ \text{columns of } H_{R(2)}\end{aligned} = \begin{aligned}\text{maximum degree of} \\ \text{the columns of } H_{R(3)} + \text{number} \\ \text{of elements of } A(=5, R(2))\end{aligned} \quad (15)$$

FIG. 12 is a diagram of degree distributions obtained as a result of the optimized calculation.

Next, the encoder 101 calculates a shortened matrix A'(s=5, R(2)) based on the formulas (9) and (10). First, the number of row divisions $Z_{R(2)}$ is calculated by using the average of ρ.

$$\begin{aligned}\text{Number of row} \\ \text{divisions } Z_{R(2)}\end{aligned} = \begin{aligned}\text{total element number of} \\ A(s=5, R(3)) \text{ and } (s=5, R(3))/\text{average of } \rho\end{aligned}$$
$$= (15 + 3)/6$$
$$= 3$$

Then, the number of rows of the shortened matrix is calculated by using the number of row divisions.

$$\begin{aligned}\text{Number of rows } m' \\ \text{of the shortened matrix}\end{aligned} = \begin{aligned}\text{code length} \times (1-R(3))/ \\ \text{number of row divisions}\end{aligned}$$
$$= 6000 \times (1 - 0.5)/3$$
$$= 1000$$

Namely, 23 rows are deleted from the lowest rank of the basic matrix A(s=5, R(2)) with 1023 rows to generate a shortened matrix A'(s=5, R(2)) with 1000 rows here, too.

Figure 13:
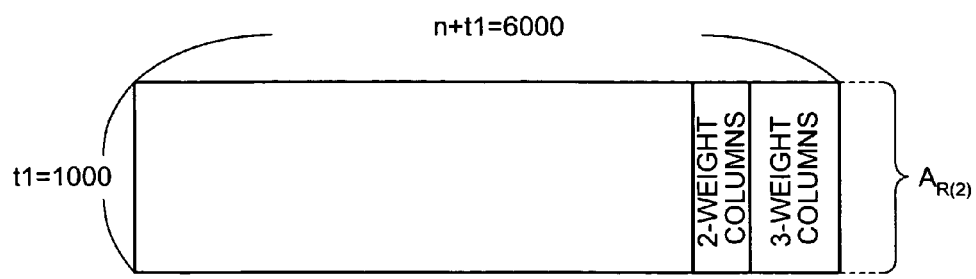
FIG. 13 is a diagram of an additional matrix $A_{R(2)}$.

Next, the encoder 101 divides the shortened matrix A'(s=5, R(2)) based on the degree distributions shown in FIG. 12, and defines the results as a temporary additional matrix $A_{R(2)}'$ with 6000 columns×1000 rows. Furthermore, the columns are reordered so that the weights of the columns of the temporary additional matrix $A_{R(2)}'$ after dividing are in ascending order, and the reordered matrix is defined as an official additional matrix $A_{R(2)}$ (matrix with (n+t1)×t1)). FIG. 13 is a diagram of the additional matrix $A_{R(2)}$. Herein, the rows with a weight of "3" are 1000 rows, the columns with a weight of "2" are 69 columns, and the columns with a weight of "3" are 954 columns.

Figure 14:
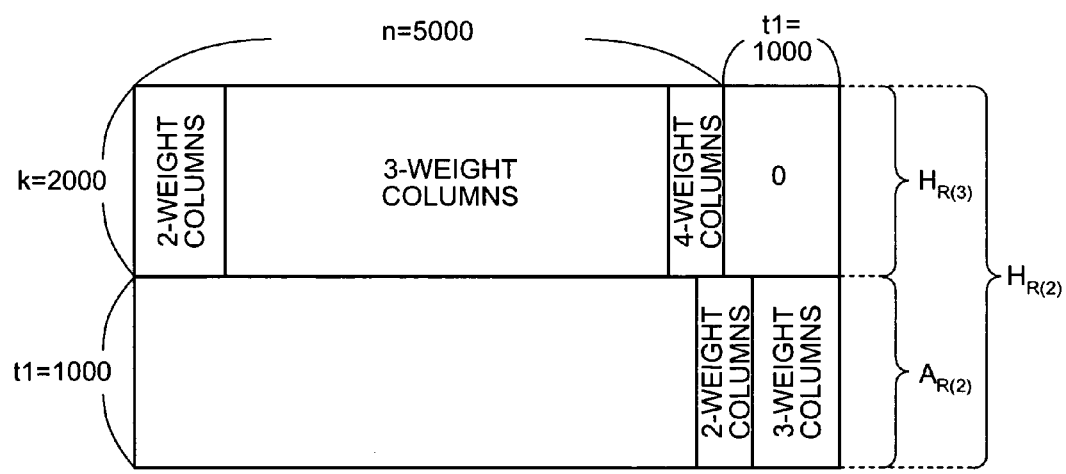
FIG. 14 is a diagram of a parity check matrix $H_{R(2)}$.

Next, the encoder 101 adds a zero matrix with t1×k (zero matrix with 1000 columns×2000 rows) to the right of the parity check matrix $H_{R(3)}$ that was generated before n×k, and generates a parity check matrix $H_{R(2)}$ (matrix with 6000 columns×3000 rows) of (n+t1)×(k+t1) including the additional matrix $A_{R(2)}$ of (n+t1)×t1. FIG. 14 is a diagram of the parity check matrix $H_{R(2)}$.

Next, the encoder 101 executes processing (optimized calculation) to calculate the parity check matrix $H_{R(1)}$ and the additional matrix $A_{R(1)}$ by using the determined data length n−k=3000 (code length n+t1+t2=8000), the code rate R(2)=0.375, the reordered basic matrix A(=5, R(1)), and the parity check matrix $H_{R(2)}$ (Step S26). This processing is executed with the same procedures as those for calculating the parity check matrix $H_{R(2)}$.

$$H_{R(1)} = \begin{bmatrix} H_{R(2)} & 0 \\ A_{R(1)} & \end{bmatrix} \quad (16)$$

Figure 15:
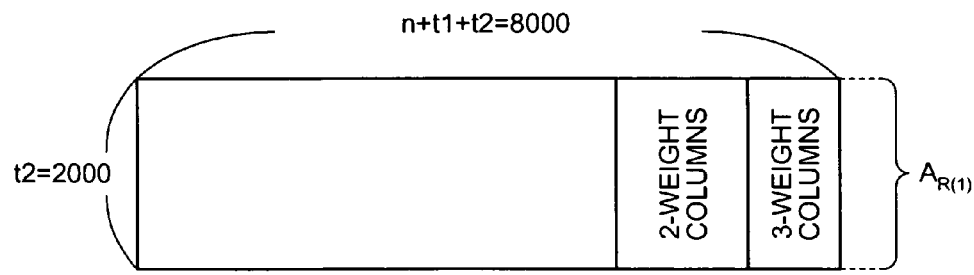
FIG. 15 is a diagram of an additional matrix $A_{R(1)}$.

Thereafter, the encoder 101 divides the rows and the columns of the shortened matrix A' (s=5, R(1)) based on the degree distributions obtained as a result of the optimized calculation, and defines the results of dividing as a temporary additional matrix $A_{R(1)}'$ with 8000 columns×2000 rows. Furthermore, reordering is carried out so that the weights of the columns of the temporary additional matrix $A_{R(1)}'$ after being divided are in ascending order, and then the reordered matrix is defined as an official additional matrix $A_{R(1)}$ (matrix of (n+t1+t2)×t2). FIG. 15 is a diagram of a detailed example of the additional matrix $A_{R(1)}$.

Figure 16:
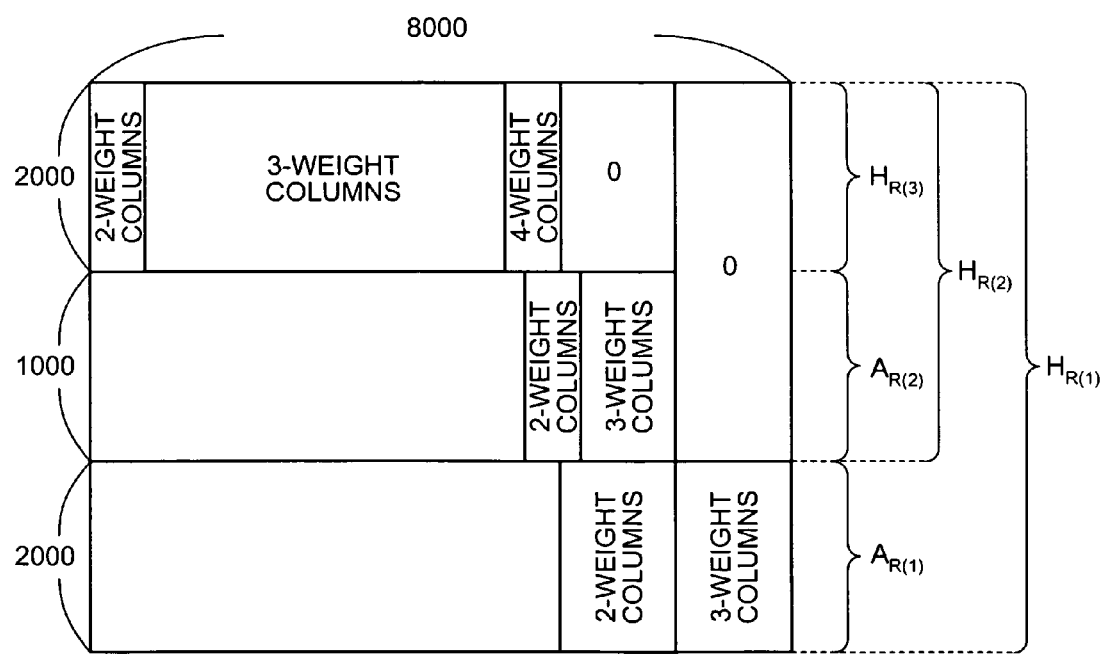
FIG. 16 is a diagram of a parity check matrix $H_{R(1)}$.

Last, the encoder 101 adds a zero matrix (2000 columns×3000 rows) of t2×(k+t1) to the right of the parity check matrix $H_{R(2)}$ of (n+t1)×(k+t1) generated before, and further generates a parity check matrix $H_{R(1)}$ (matrix with 8000 columns×5000 rows) of (n+t1+t2)×(k+t1+t2) including the additional matrix AR(2) of (n+t1+t2)×t2 generated as mentioned above, below the matrix of (n+t1+t2)×(k+t1) after being added with the zero matrix. FIG. 16 is a diagram of a detailed example of the parity check matrix $H_{R(1)}$.

As described above, according to this embodiment, check matrices $H_{R(3)}$, $H_{R(2)}$, and $H_{R(1)}$ for "irregular-LDPC codes" which are definitive and have stable characteristics can be generated by carrying out the steps S21 through S26.

In this embodiment, the Euclidean geometry codes are used as basic codes (a basic matrix), however, the codes are not limited to these and may be a matrix (a basic matrix according to the Cayley graph or the Ramanujan graph, etc.) other than the Euclidean geometry codes as long as the matrix satisfies the conditions of "fixed row and column weights" and "6 or more cycles on a bipartite graph".

According to the embodiment, the parity check matrix $H_{R(1)}$ corresponding to the code rate R(1) is generated last, however, without limiting to this, it is also possible that, according to the system requirements (communications environment, etc.), a code rate according to need can be set and a parity check matrix corresponding to this set code rate is generated. In the embodiment, a three-stage parity check matrix is assumed, however any number of stages can be used as long as excellent characteristics are obtained.

Furthermore, in this embodiment, L of the initial transmission was set to 2 through max. −1, however, it is also possible that L=max. When L of the initial transmission equals the maximum (R(max)=1), it means non-coding, so that encoding by the encoder 101 is not carried out. In the following explanation, processing when the parity check matrix of the initial transmission is defined as $H_{R(L)}$, and the parity check matrices of the retransmissions are defined as $H_{R(L-1)}$, $H_{R(L-2)}$, $H_{R(L-3)}$, and $H_{R(L-4)}$ is explained.

As described above, after generating the parity check matrices $H_{R(L)}$, $H_{R(L-1)}$, $H_{R(L-2)}$ . . . by the processing of Step S1, then the encoder 101 calculates a generator matrix $G_{R(L)}$ of the initial transmission, satisfying "$H_{R(L)} \times G_{R(L)} = 0$" by using this parity check matrix $H_{R(L)}$ (FIG. 1, Step S1). Herein, the processing of generating the generator matrix $G_{R(L)}$ of the initial transmission is explained in detail.

Figure 17:
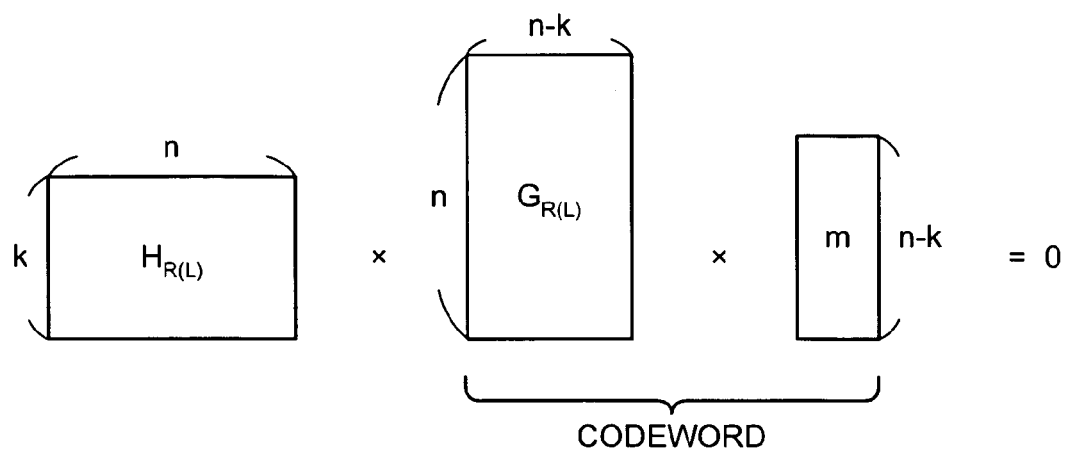
FIG. 17 is a diagram of a condition for generating a generator matrix $G_{R(L)}$.
Figure 18:
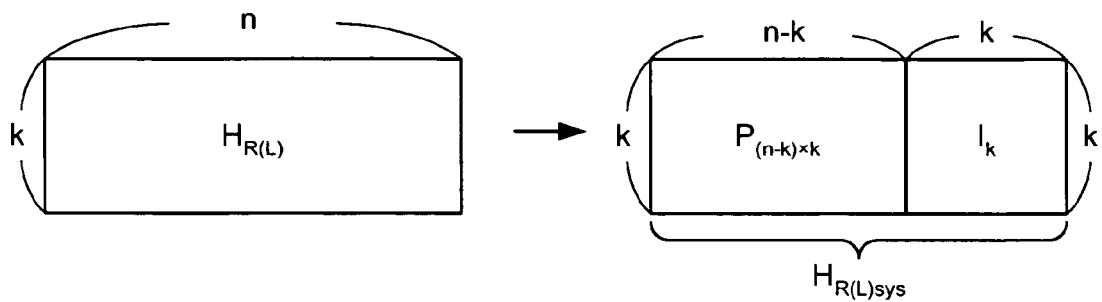
FIG. 18 is a diagram of conversion processing into an irreducible standard format check matrix $H_{R(L1)SYS} = [P_{(n-k) \times k} | I_k]$.

First, in order to generate the generator matrix $G_{R(L)}$ satisfying "$H_{R(L)} \times G_{R(L)} = 0$", that is, satisfying the condition of FIG. 17, the encoder 101 converts the parity check matrix $H_{R(L)}$ into an irreducible standard format check matrix $H_{R(L)sys} = [P_{(n-k) \times k} | I_k]$ of FIG. 18. The parity check matrix $H_{R(L)}$ is full rank (linearly independent), so that the irreducible standard format check matrix $H_{R(L)sys}$ can be invariably generated. Herein, P denotes a check symbol generator matrix, and I denotes a unit matrix.

Figure 19:
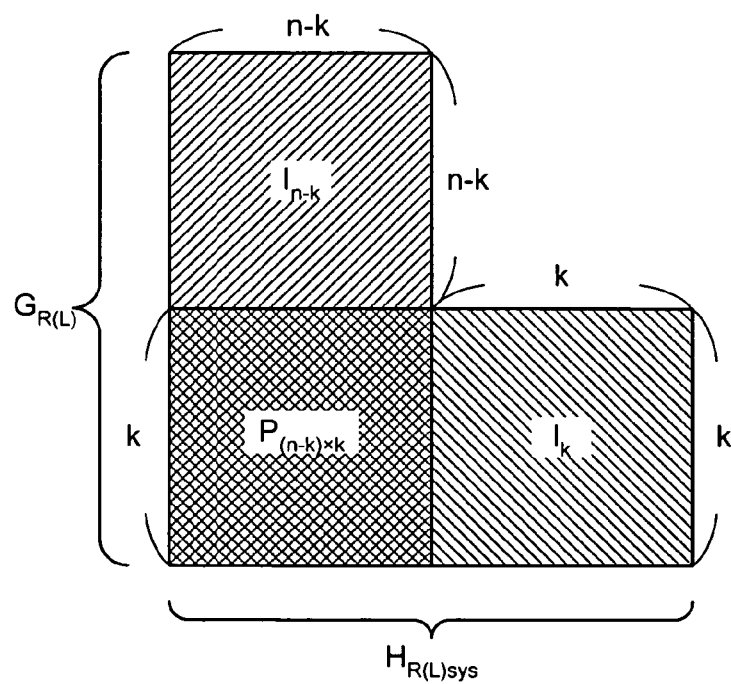
FIG. 19 is a diagram of processing of generating an irreducible standard format generator matrix $G_{R(L)}$ for initial transmission.

Next, the encoder 101 generates, as shown in FIG. 19, an irreducible standard format generator matrix $G_{R(L)}$ of $(n-k) \times n$ of the initial transmission, composed of the check symbol generator matrix $P_{(n-k) \times k}$ and the unit matrix $I_{n-k}$.

As described above, after generating the parity check matrix $H_{R(L)}$ for the initial transmission and the generator matrix $G_{R(L)}$ for the initial transmission by the processing of Step S1, the encoder 101 generates a codeword $C_{R(L)} = G_{R(L)} \times m$ as shown in FIG. 17 (Step S2). Herein, $m = m_1, m_2 \ldots m_{n-k}$. Then, the converter 102 applies digital modulation of BPSK, QPSK, or multilevel QAM, etc., to the generated codeword $C_{R(L)}$, and transmits it (Step S2).

Next, in the receiving side communications device, the demodulator 104 applies digital demodulation of BPSK, QPSK, or multilevel QAM, etc., to the modulated signal received via the communications path 107, and then the demodulator 105 carries out repetitive decoding by the "sum-product algorithm" for the LDPC encoded results of demodulation (Step S11). As a result, when the data of the initial transmission is normally received (Step S12=YES), the retransmission controller 106 replies ACKnowledgement (ACK) to the transmitting side communications device (Step S13). Then, the transmitting side communications device that has received ACK (Step S3=Yes) deletes the initially transmitted data after saving it for retransmission.

On the other hand, according to the judgment at Step S12, when the initially transmitted data is not normally received (Step S12=No), the retransmission controller 106 replies NAK to the transmitting side communications device, and simultaneously saves the received data of the initial transmission (Step S14), and then enters a retransmission data receiving waiting state (Step S15).

Next, in the transmitting side communications device that has received NAK (Step S3=No), the retransmission controller 103 instructs the encoder 101 to generate, for example, an additional parity as a retransmitting data when the Type-II HARQ is employed. Then, by using a parity check matrix $H_{R(L-1)}$ (matrix of $(n+t1) \times (k+t1)$) of the retransmission at the code rate R(L-1) lower than the initial transmission code rate generated at Step S1, the encoder 101 calculates a generator matrix $G_{R(L-1)}$ (matrix of $(n-k) \times (n+t1)$) of retransmission satisfying "$H_{R(L-1)} \times G_{R(L-1)} = 0$" (Step S4). Herein, processing of generating the generator matrix $G_{R(L-1)}$ of retransmission is explained in detail.

Figure 20:
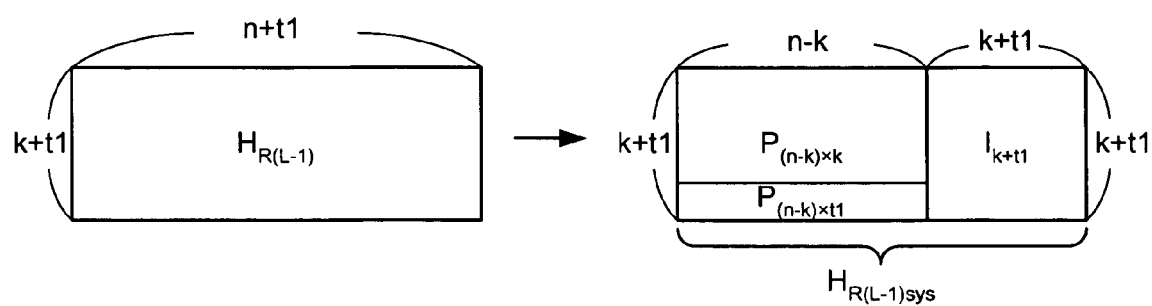
FIG. 20 is a diagram of conversion processing into an irreducible standard format check matrix $H_{R(L-1)SYS} = [P_{(n-k) \times (k+t1)} | I_{k+t1}]$.

First, to generate the generator matrix $G_{R(L-1)}$ satisfying "$H_{R(L-1)} \times G_{R(L-1)} = 0$", the encoder 101 converts the parity check matrix $H_{R(L-1)}$ into the irreducible standard format check matrix $H_{R(L-1)SYS} = [P_{(n-k) \times k} / P_{(n-k) \times t1} | I_{k+t1}]$ as shown in FIG. 20. The parity check matrix $H_{R(L-1)}$ is full rank (linearly independent), so that the irreducible standard format check matrix $H_{R(L-1)SYS}$ can be invariably generated. The check symbol generator matrix $P_{(n-k) \times k}$ shown in FIG. 20 is identical to the check symbol generator matrix $P_{(n-k) \times k}$ shown in FIG. 18.

Figure 21:
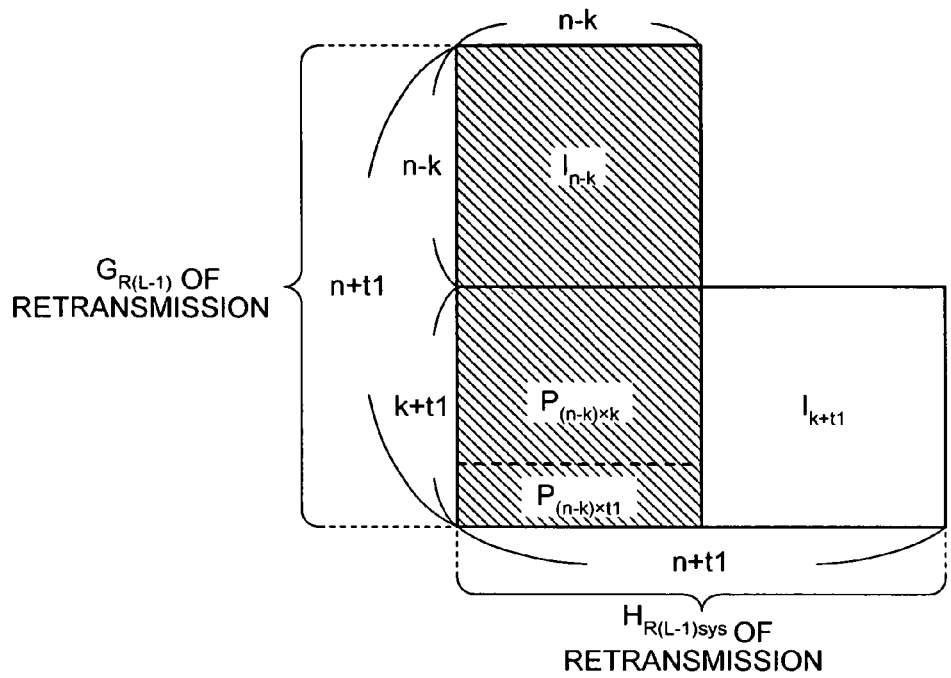
FIG. 21 is a diagram of processing of generating an irreducible standard format generator matrix $G_{R(L-1)}$ for retransmission.

Next, the encoder 101 generates an irreducible standard format check matrix $G_{R(L-1)}$ of $(n-k) \times (n+t1)$ of retransmission, composed of the check symbol generator matrix $P_{(n-k)(k+t1)}$ and the unit matrix $I_{n-k}$ as shown in FIG. 21.

Figure 22:
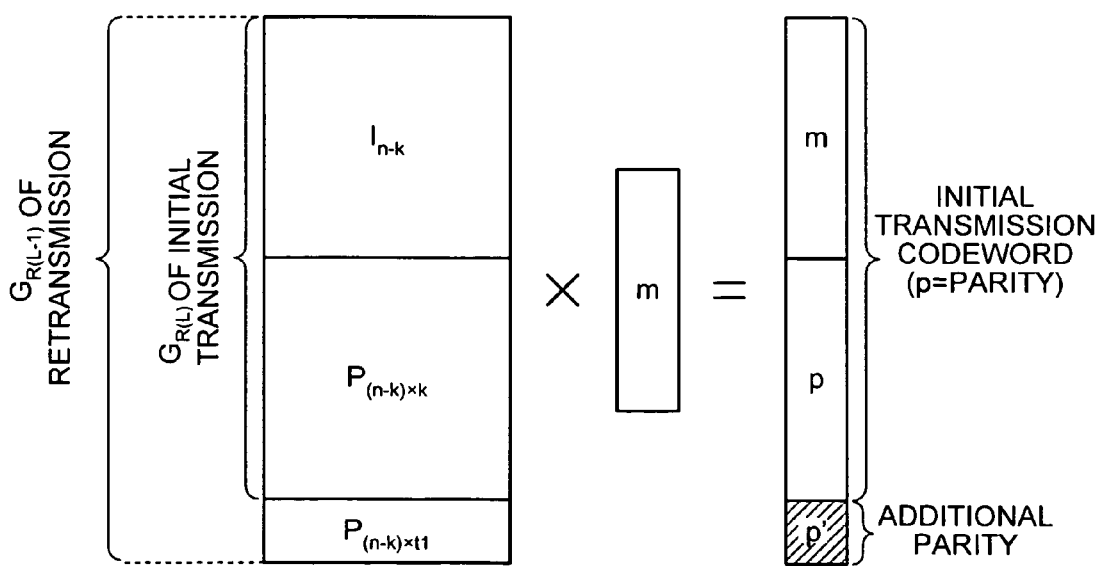
FIG. 22 is a diagram of a codeword for retransmission.

As described above, the irreducible standard format check matrix $G_{R(L-1)}$ of retransmission is generated by the processing of Step S4, and then the encoder 101 generates an additional parity p' ($p' = P_{(n-k) \times t} \times m$) marked with diagonal lines in FIG. 22 (Step S5). FIG. 22 is a diagram of a codeword of retransmission. Herein, $m = m_1, m_2 \ldots m_{n-k}$. The modulator 102 applies digital modulation of BPSK, QPSK, or multilevel QAM, etc., to the generated additional parity p' and transmits it (Step S5).

Next, in the receiving side communications device, the demodulator 104 applies predetermined digital demodulation as described above to the modulated signal received via the communications path 107 (Step S15), and furthermore, the decoder 105 carries out repetitive decoding by the "sum-product algorithm" by synthesizing the received data of the initial transmission saved in advance by the processing of Step S14 and the demodulated additional parity (Step S16). As a result, when the initial transmitted data is normally received (Step S17=Yes), the retransmission controller 106 replies ACK to the transmitting side communications device (Step S18). Then, in transmitting side communications device that has received ACK (Step S6=Yes) deletes the transmission data saved for retransmission and the additional parity.

On the other hand, according to the judgment at Step S17, when the data of the initial transmission cannot be normally received (Step S17=No), the retransmission controller 106 transmits NAK to the transmitting side communications device, and at the same time, saves the additional parity (Step S19), and thereafter, enters a re-retransmission data receiving wait state (Step S15).

Then, in the transmitting side communications device that has received NAK (Step S6=No), the retransmission controller 106 instructs the encoder 101 to further generate an additional parity, and repeatedly carries out the processing of Steps S4 through S6 while lowering the code rate (R(L−2), R(L−3) . . . ) until ACK is replied (Step S6=Yes). On the other hand, in the receiving side communications device, the processing of Steps S15 through S19 is repeatedly carried out while repeating the synthesis until the initially transmitted data is normally decoded (Step S17=Yes).

As described above, in the retransmission control method of this embodiment, as error correcting codes when the Type-II HARQ is employed, for example, LDPC codes with excellent characteristics very close to the Shannon limit are applied, and for retransmission, a generator matrix for retransmission is generated from a parity check matrix corresponding to a code rate lower than the code rate of the initial transmission or the previous retransmission, and based on the generation results, only the additional parity is transmitted. Thereby, even when the code rate is great, without thinning-out the parity bits as in the conventional cases, an optimum parity can always be transmitted, so that the characteristics can be made stable and the original error correcting code performance can always be obtained.

INDUSTRIAL APPLICABILITY

As described above, the retransmission control method and the communications device of the invention are useful for communications systems employing LDPC codes, and particularly, suitable for communications systems that apply LDPC codes as error correcting codes when the Type-II HARQ is employed.

The invention claimed is:

1. A retransmission control method for a communications device that transmits a codeword to another communications device using low-density parity check codes as error correcting codes, the retransmission control method comprising:
generating N parity check matrices optimized at N code rates, respectively, where N is a positive integer, wherein a k-th code rate is lower than a (k−1)-th code rate, where k is a positive integer from 2 to N;
converting a first parity check matrix so that the first parity check matrix contains a check symbol generator matrix;
generating a generator matrix containing the check symbol generator matrix;
transmitting the codeword generated by using the generator matrix to the another communications device;
generating, when the communications device receives a negative acknowledgment from the another communications device in response to the codeword, a first additional parity by using a second parity check matrix;
retransmitting the first additional parity to the another communications device;
generating, when the communications device receives a negative acknowledgment from the another communications device in response to a (k−1)-th additional parity generated by using a k-th parity check matrix, a k-th additional parity by using the (k+1)-th parity check matrix; and
retransmitting the k-th additional parity to the another communications device.

2. The retransmission control method according to claim 1, wherein the generating N parity check matrices includes:
determining each of the N code rates;
generating N basic matrices each of which corresponding to each of the N code rates based on a matrix of which row weights and column weights are constant and a number of cycles in a bipartite graph is equal to or more than 6;
generating the first parity check matrix by optimizing degree distributions of row weights and column weights of the first parity check matrix through execution of Gaussian approximation based on a first code rate, and by dividing any one of row weights and column weights or both of a first basic matrix based on the degree distributions; and
generating the k-th parity check matrix by adding a (k−1)-th additional matrix to the (k−1)-th parity check matrix, wherein the (k−1)-th additional matrix is generated by optimizing degree distributions of row weights and column weights of the k-th parity check matrix through execution of Gaussian approximation based on the k-th code rate, and by dividing at least one of row weights and column weights of a k-th basic matrix being divided based on the degree distributions, wherein the Gaussian approximation based on the k-th code rate is executed under constraints of:
the k-th parity check matrix including the (k−1)-th parity check matrix,
the k-th parity check matrix being linearly independent,
a number of columns of the (k−1)-th parity check matrix being less than a number of columns of the k-th parity check matrix,
a number of rows of the (k−1)-th parity check matrix being less than a number of rows of the k-th parity check matrix, and
a value obtained by subtracting the number of columns of the (k−1)-th parity check matrix from the number of columns of the k-th parity check matrix being equal to a value obtained by subtracting the number of rows of the (k−1)-th parity check matrix from the number of rows of the k-th parity check matrix.

3. The retransmission control method according to claim 2, wherein the N code rates are determined in a phased manner according to system requirements.

4. The retransmission control method according to claim 2, wherein the matrix of which row weights and column weights are constant and a number of cycles in a bipartite graph is equal to or more than 6 is comprised of Euclidean geometry codes.

5. The retransmission control method according to claim 1, wherein the generating the k-th additional parity includes:
converting the k-th parity check matrix so that the k-th parity check matrix contains a check symbol generator matrix P;
converting the (k+1)-th parity check matrix so that the (k+1)-th parity check matrix contains check symbol generator matrices P and P';
generating a generator matrix that contains the check symbol generator matrices P and P'; and
generating the k-th additional parity by using the check symbol matrix P'.

6. A communications device that transmits a codeword to another communications device using low-density parity check codes as error correcting codes, the communications device comprising:
a retransmission control unit that controls a retransmission when the communications device receives a negative acknowledgement from the another communications device;
an encoding unit that includes
a parity-check-matrix generating unit that generates N parity check matrices optimized at N code rates, respectively, where N is a positive integer, wherein a k-th code rate is lower than a (k−1)-th code rate, where k is a positive integer from 2 to N;
a converting unit that converts a first parity check matrix so that the first parity check matrix contains a check symbol generator matrix;
a generator-matrix generating unit that generates a generator matrix containing the check symbol generator matrix; and
a codeword generating unit that generates the codeword by using the generator matrix; and
a modulation unit that applies predetermined digital modulation to the codeword and transmits the codeword to the another communications device, wherein
when the communications device receives a negative acknowledgement from the another communications device in response to the codeword, the encoding unit generates a first additional parity by using a second parity check matrix and the modulation unit applies predetermined digital modulation to the first additional parity, and when the communications device receives a negative acknowledgement from the another communications device in response to a (k−1)-th additional parity generated by using a k-th parity check matrix, the encoding unit generates a k-th additional parity by using the (k+1)-th parity check matrix and the modulation unit applies predetermined digital modulation to the k-th additional parity.

7. The communications device according to claim 6, wherein the parity-check-matrix generating unit includes:
   a determining unit that determines each of the N code rates;
   a first generating unit that generates N basic matrices each of which corresponding to each of the N code rates based on a matrix of which row weights and column weights are constant and a number of cycles in a bipartite graph is equal to or more than 6; and
   a second generating unit that generates the first parity check matrix by optimizing degree distributions of row weights and column weights of the first parity check matrix through execution of Gaussian approximation based on a first code rate, and by dividing any one of row weights and column weights or both of a first basic matrix based on the degree distributions, and that generates the k-th parity check matrix by adding a (k−1)-th additional matrix to the (k−1)-th parity check matrix, wherein the (k−1)-th additional matrix is generated by optimizing degree distributions of row weights and column weights of the k-th parity check matrix through execution of Gaussian approximation based on the k-th code rate, and by dividing at least one of row weights and column weights of a k-th basic matrix based on the degree distributions, wherein the Gaussian approximation based on the k-th code rate is executed under constraints of:
     the k-th parity check matrix including the (k−1)-th parity check matrix,
     the k-th parity check matrix being linearly independent,
     a number of columns of the (k−1)-th parity check matrix being less than a number of columns of the k-th parity check matrix,
     a number of rows of the (k−1)-th parity check matrix being less than a number of rows of the k-th parity check matrix, and
     a value obtained by subtracting the number of columns of the (k−1)-th parity check matrix from the number of columns of the k-th parity check matrix being equal to a value obtained by subtracting the number of rows of the (k−1)-th parity check matrix from the number of rows of the k-th parity check matrix.

8. The communications device according to claim 7, wherein the second generating unit includes:
   a first converting unit that converts the k-th parity check matrix so that the k-th parity check matrix contains a check symbol generator matrix P;
   a second converting unit that converts the (k+1)-th parity check matrix so that the (k+1)-th parity check matrix contains check symbol generator matrices P and P';
   a generator-matrix generating unit that generates a generator matrix that contains the check symbol generator matrices P and P'; and
   an additional parity generating unit that generates the k-th additional parity by using the check symbol matrix P'.

9. A communications device comprising:
   a unit that generates Low-Density Parity-Check codes as error correcting codes, including:
     generating parity check matrix optimized at respective predetermined code rates,
     converting a first parity check matrix so that the first parity check matrix contains a check symbol generator matrix, and
     generating a generator matrix containing the check symbol generator matrix;
   a unit that transmits a codeword that has been encoded at a predetermined code rate of initial transmission, and transmit an additional parity in retransmission, wherein the generator matrix is used to generate the additional parity.

* * * * *